United States Patent
Kim

(10) Patent No.: US 8,027,208 B2
(45) Date of Patent: Sep. 27, 2011

(54) FLASH MEMORY DEVICE AND PROGRAMMING METHOD THEREOF

(75) Inventor: Moo-Sung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 12/457,487

(22) Filed: Jun. 12, 2009

(65) Prior Publication Data

US 2010/0002518 A1    Jan. 7, 2010

(30) Foreign Application Priority Data

Jul. 7, 2008   (KR) .................. 10-2008-0065693

(51) Int. Cl.
*G11C 7/00*    (2006.01)

(52) U.S. Cl. ......... 365/189.14; 365/189.09; 365/189.16; 365/185.18; 365/230.06

(58) Field of Classification Search ............. 365/185.18, 365/230.06, 189.09, 189.14, 189.16
See application file for complete search history.

(56) References Cited

U.S. PATENT DOCUMENTS

| 6,907,497 | B2 * | 6/2005 | Hosono et al. ................. 711/103 |
| 7,099,193 | B2 | 8/2006 | Futatsuyama |
| 7,355,887 | B2 | 4/2008 | Nakamura et al. |
| 2005/0105334 | A1 | 5/2005 | Futatsuyama |
| 2005/0237829 | A1 | 10/2005 | Nakamura et al. |
| 2006/0104114 | A1 * | 5/2006 | Toda ......................... 365/185.03 |

FOREIGN PATENT DOCUMENTS

| JP | 2005-108404 | 4/2005 |
| JP | 2005-327436 | 11/2005 |
| KR | 10-0642187 | 10/2006 |
| KR | 10-0763093 | 9/2007 |

OTHER PUBLICATIONS

Abstract of KR 10-2005-00025907 published Mar. 14, 2005.

* cited by examiner

*Primary Examiner* — Son T Dinh

(74) *Attorney, Agent, or Firm* — Harness, Dickey & Pierce, P.L.C.

(57) ABSTRACT

The flash memory device includes a memory cell array having a plurality of memory cells, a high voltage generator configured to generate a plurality of pass voltages, with a first pass voltage of the plurality of pass voltages supplied to the memory cell array during a programming operation; and a main controller including a voltage controller configured to shift the first pass voltage at a plurality of time intervals during the programming operation.

23 Claims, 12 Drawing Sheets

FLASH MEMORY DEVICE AND PROGRAMMING METHOD THEREOF

PRIORITY STATEMENT

This U.S. non-provisional patent application claims priority under 35 U.S.C. §119 of Korean Patent Application No. 10-2008-65693 filed on Jul. 7, 2008, the entire contents of which are incorporated herein by reference.

BACKGROUND

Example embodiments of the present invention disclosed herein relate to flash memories. For example, an example embodiment of the present invention relates to a flash memory device capable of adjusting a pass voltage level and a programming method thereof.

Recently, as flash memory devices have decreased in size, interest in assuring pass voltage windows has increased.

In practice, during a programming operation of a flash memory device, a program voltage is applied to a selected word line while a pass voltage is applied to unselected word lines.

Program voltage disturbance caused by a low pass voltage results in a malfunction to program-inhibited memory cells from among a plurality of memory cells coupled to a word line to which the program voltage is applied, resulting in a failed programming operation. On the other hand, pass voltage disturbance caused by a high pass voltage results in a malfunction to memory cells among the plurality of memory cells coupled to the same cell string, to which the pass voltage is applied, resulting in a failed programming operation.

Thus, the pass voltage window defines a range of the pass voltage that does not result in the pass voltage disturbance and the program voltage disturbance. A broader pass voltage window increases a reliability of the flash memory device.

However, in practice, a pass voltage window is only determined after fabricating out a wafer including flash memory devices. If there is an insufficient pass voltage window, a programming method must be modified and revised several times, which delays a development or turnaround time of the flash memory devices.

SUMMARY

An example embodiment of the present invention provides a flash memory device capable of adjusting a pass voltage in voltage level and a programming method thereof.

According to an example embodiment, a flash memory device includes a memory cell array having a plurality of memory cells, a high voltage generator configured to generate a plurality of pass voltages, with a first pass voltage of the plurality of pass voltages supplied to the memory cell array during a programming operation; and a main controller including a voltage controller configured to shift the first pass voltage at a plurality of time intervals during the programming operation.

In an example embodiment, the voltage controller is configured to incrementally shift a voltage level of at least the first pass voltage during a first period of the programming operation, where the first period includes at least one of the plurality of time intervals.

In an example embodiment, the voltage controller is configured to maintain at least the first pass voltage at a constant voltage level during a second period of the programming operation, where the second period includes at least one of the plurality of time intervals.

In an example embodiment, the voltage controller is configured to vary a voltage level of at least the first pass voltage during each of the time intervals of a first period of the programming operation, where the first period includes more than one of the plurality of time intervals.

In an example embodiment, the main controller further includes a selection identifier configured to determine, higher and lower word-line address bits based on an input word-line address and constants M and N, where M and N are natural numbers, a selected area of a memory array based on the higher and lower word-line address bits, and an unselected area of the memory array based on the selected area, wherein the selection identifier is configured to select the first pass voltage generated by the high voltage generator to be applied to a word line of the selected area, and selects a second pass voltage of the plurality of pass voltages generated by the high voltage generator to be applied to a word line of the unselected area.

In an example embodiment, word-line addresses of the memory array are divided into a first plurality of zones.

In an example embodiment, word-line addresses of the selected area are further divided into a second plurality of zones.

In an example embodiment, the memory array is divided into a plurality of zones, a set of pass voltages from the plurality of pass voltages generated by the high voltage generator is associated with each zone of the plurality of zones, the set of pass voltages include at least one voltage and the set of pass voltages associated with each of the zones are different, and the selection identifier is configured to select the first pass voltage from the set of voltages associated with the zone corresponding to the selected area.

In an example embodiment, the selection identifier is configured to select the first pass voltage based on the word-line address.

In an example embodiment, information about the M and the N is stored in one of an electric fuse and a nonvolatile memory.

In an example embodiment, the memory array is a nonvolatile memory and includes at least one of a NAND flash memory, a NOR flash memory, phase-change random access memory, and a magnetic random access memory.

In an example embodiment, the M and the N are natural numbers and less than a total number of word lines in the memory array.

In an example embodiment, the main controller further includes a selective controller configured to select the first pass voltage from the plurality of pass voltages generated by the high voltage generator for the selected area in response to a set of enabling signals received from the selection identifier and configured to shift the first pass voltage according to a control signal received from the voltage controller, before the first pass voltage is supplied to the memory cell array.

In an example embodiment, the main controller further includes a deselective controller configured to select the second pass voltage from the plurality of pass voltages generated by the high voltage generator for the unselected area in response to the set of enabling signals, before the second pass voltage is supplied to the memory cell array.

According to an example embodiment, a main controller includes a selection identifier configured to determine higher and lower word-line address bits based on an input word-line address and constants M and N, where the M and the N are natural numbers, a selected area of a memory array based on the higher and lower word-line address bits, and an unselected area of the memory array based on the selected area, where the selection identifier outputs a set of enabling signals based on the determined selected and unselected areas, a selective controller configured to receive a first plurality of pass voltages and selectively output one of the first plurality of pass voltages for the selected area in response to the set of enabling signals, a deselective controller configured to receive a second plurality of pass voltages and selectively output one of the second plurality of pass voltages for the unselected area in response to the set of enabling signals, a voltage controller configured to control the selective controller to shift at least one of the first plurality of pass voltages received by the selective controller during a plurality of time periods of a program interval, and a control driver configured to receive and selectively output one of the outputs of the selective and deselective controllers in response to the set of enabling signals.

In an example embodiment, the main controller may be included in a flash memory device having a memory array, a high voltage controller configured to generate the first and second plurality of pass voltages, and a word line driver configured to control word lines of the memory array based on the output of control driver.

In an example embodiment, the memory array is divided into a plurality of zones, a set of pass voltages is associated with each zone of the plurality of zones, the set of pass voltages include at least one voltage and the set of pass voltages associated with each of the zones are different, the high voltage controller is configured to generate the set of pass voltages associated with each of the zones from at least the first plurality of pass voltages, and the selective controller is configured to select a first pass voltage from the set of voltages associated with the zone corresponding to the selected area based on the set of enabling signals.

According to an example embodiment a programming method of a flash memory includes setting two constants M and N, where the M and the N are natural numbers, inputting word-line address information to be programmed, determining the word-line address information to be programmed, higher and lower word-line address bits based on the word-line address information and the constants M and N, a selected area of the flash memory based on the higher and lower word-line addresses, and an unselected area of the flash memory based on the selected area, applying a first pass voltage to an address of the selected area, applying a second pass voltage to an address of the unselected area, and shifting the first pass voltage at a plurality of time intervals.

In an example embodiment, the method includes supplying a program voltage to the word-line address to be programmed.

In an example embodiment, the method includes dividing word-line addresses of the flash memory into a plurality of zones.

In an example embodiment, the method includes associating a set of pass voltages with each zone of the plurality of zones, the set of pass voltages include at least one voltage and the set of pass voltages associated with each of the zones are different, and selecting the first pass voltage from the set of voltages associated with the zone corresponding to the selected area.

In an example embodiment, the method includes selecting the first pass voltage based on the word-line address information.

In an example embodiment, the constants M and N are less than a total number of word lines in the memory array.

A further understanding of example embodiments of the present invention herein may be realized by reference to the remaining portions of the specification and the attached drawings.

BRIEF DESCRIPTION

Non-limiting and non-exhaustive embodiments of the present invention will be described with reference to the following figures, wherein like reference numerals refer to like parts throughout the various figures unless otherwise specified. In the figures.

DETAILED DESCRIPTION

Figure 1:
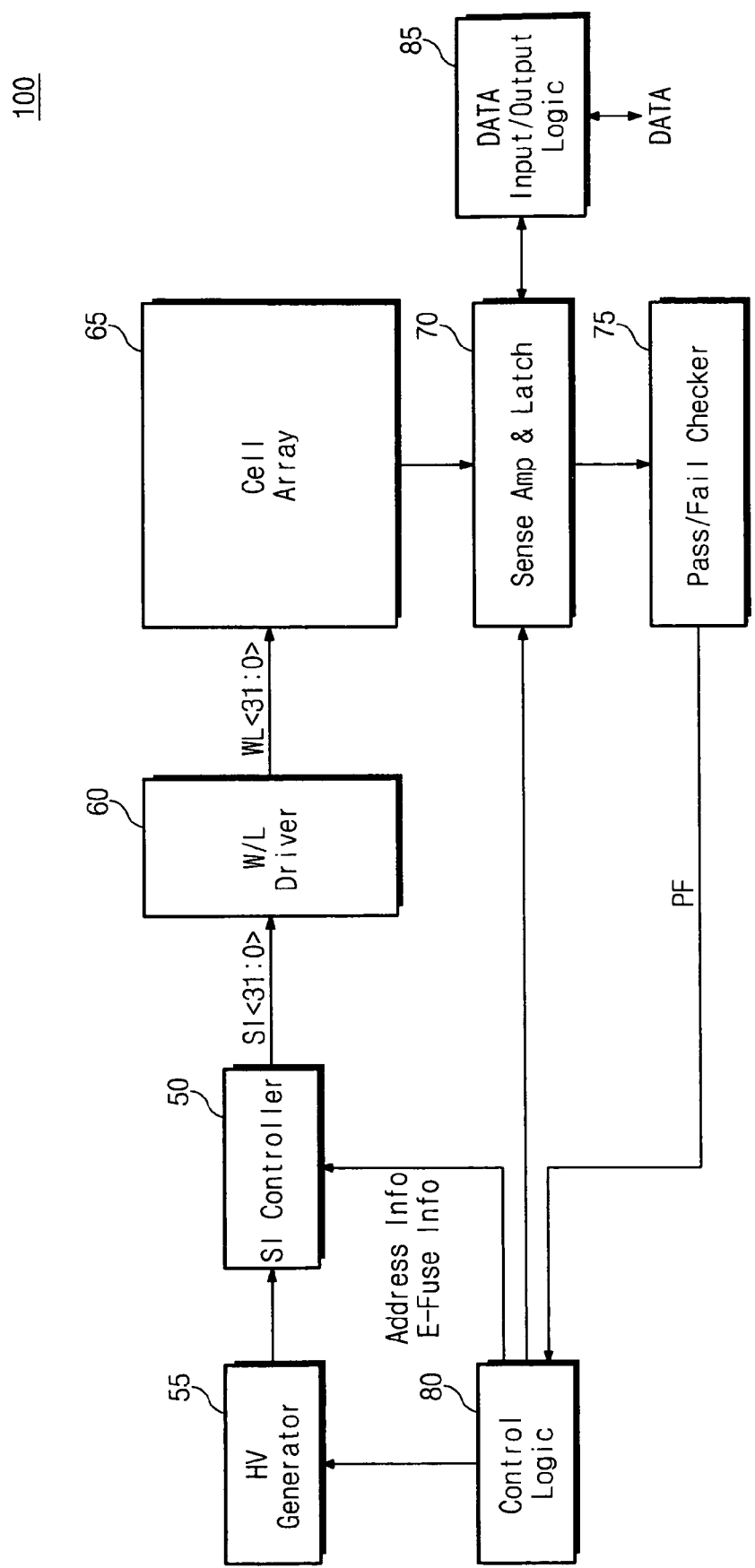
FIG. 1 is a block diagram of a flash memory device according to an example embodiment of the present invention.

Example embodiments of the present invention will be described below in more detail with reference to the accompanying drawings. The present invention may, however, be embodied in different forms and should not be constructed as limited to the example embodiments set forth herein. Rather, example embodiments are provided so that this disclosure will be thorough and complete, and will fully convey the scope of the present invention to those skilled in the art. Like reference numerals refer to like elements throughout the accompanying figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Now, in order to more specifically describe example embodiments, example embodiments will be described in detail with reference to the attached drawings. However, example embodiments are not limited to the embodiments described herein, but may be embodied in various forms.

For memory cells around which a program voltage is coupled, when the same pass voltage is applied to previously programmed memory cells (programmed memory cells) and non-programmed memory cells, the applied pass voltage causes the programmed and non-programmed memory cells to be changed into different threshold voltages from each other. For example, if the same pass voltage is applied to the programmed and non-programmed memory cells, it reduces a pass voltage window.

One or more example embodiments of the present invention may discriminately apply pass voltages to the programmed and non-programmed memory cells, thus enlarging the pass voltage window. In addition, according to an example embodiment of the present invention, the total word-line address is divided into a plurality of zones to which local voltages are each applied at different levels. The pass voltages applied to the memory cells during a programming operation are controlled according to a zone of the word-line address.

For example, on a word line to which the program voltage is applied, a pass voltages having a different voltage levels may be applied to memory cells connected to the higher M-numbered and lower N-numbered word lines (where M and N are natural numbers), in order to increase or maximize a width of the pass voltage window. The applying of different pass voltages according to zones is explained in more detail with respect to FIGS. 6-8 below.

The pass voltage applied to an unselected area does not significantly affect the pass voltage window. The pass voltage applied to the selected zone determines the pass voltage window.

FIG. 1 is a block diagram of a nonvolatile memory device according to an example embodiment of the present invention. Referring to FIG. 1, the nonvolatile memory device 100 according to an example embodiment of the present invention is a flash memory device. The nonvolatile memory device 100 includes an SI controller 50, a word line driver (W/L driver) 60, a high voltage generator (HV generator) 55, a memory cell array 65, a sense amplifier & latch circuit 70, a pass/fail checker 75, a control logic circuit 80, and a data input/output circuit 85.

The nonvolatile memory device (e.g., flash memory device) 100 includes the memory cell array 65 having memory cells arranged in a matrix of rows (or word lines) and columns (or bit lines).

Each of the memory cells arranged in the memory cell array 65 may store 1-bit data. Alternatively, each of the memory cells may able to store n-bit data (where n=2 or an integer larger than 2). The word line driver 60 selects one of the word lines in response to a word line address, and couples one of a plurality of high voltages, which are supplied from the high voltage generator 55, to the selected word line through the SI controller 50.

The sense amplifier & latch circuit 70 is controlled by the control logic circuit 80 and reads data from the memory cell array 65 in a reading/verifying operation.

In the reading operation, data read out from the memory cell array 65 is output externally through the data input/output circuit 85. In the verifying operation, data read out is output through the pass/fail checker 75. The sense amplifier & latch circuit 70 receives data, which is to be written into the memory cell array 65 in a programming operation, through the data input/output circuit 85, and drives bit lines of the memory cell array 65 according to a program voltage (e.g., a level of the ground voltage) or a program-inhibition voltage (e.g., a level of the power source voltage) in correspondence with the received data.

The pass/fail checker 75 determines whether data values output from the sense amplifier & latch circuit 70 during the program/erasure-verifying operation are the same (e.g., pass data value). From this determination, the pass/fail checker 75 outputs a pass/fail signal PF to the control logic circuit 80. The word line driver 60 controls the word lines of the memory device 100. The high voltage generator 55 operates to generate a plurality of voltages higher than the power source voltage VDD. The SI controller 50 receives address and electric fuse (E-FUSE) information from the control logic circuit 80, and outputs a signal SI<31:0> to the word line driver 60.

Figure 2:
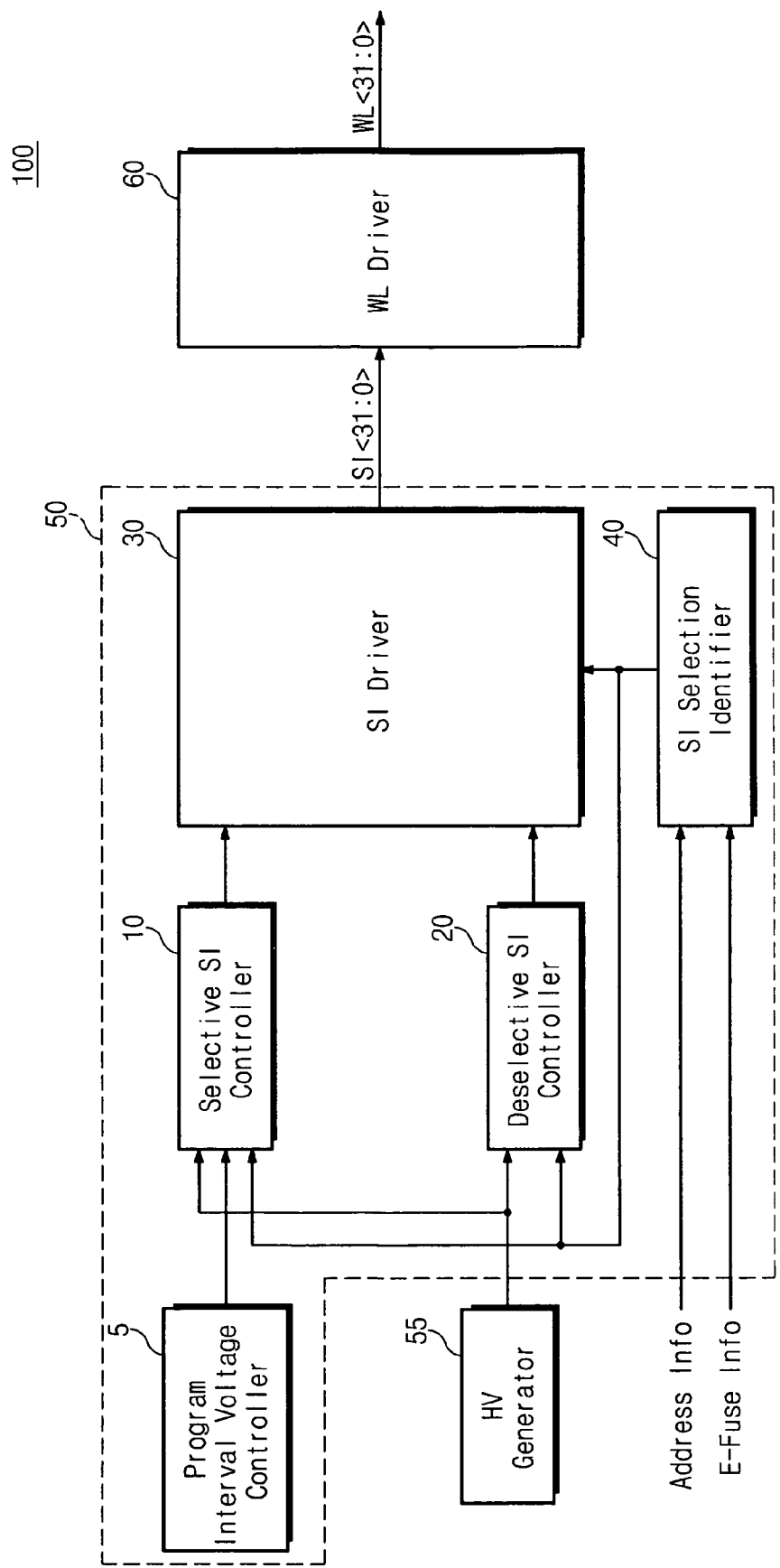
FIG. 2 is a block diagram schematically illustrating the SI controller shown in FIG. 1.

FIG. 2 is a block diagram schematically illustrating the SI controller 50 shown in FIG. 1.

Referring to FIGS. 1 and 2, the SI controller 50 according to an example embodiment of the present invention provides the word line driver 60, which controls the word lines of the flash memory device, with one of the plurality of high voltages generated from the high voltage generator 55. The SI controller 50 includes a program-interval voltage controller 5, a selective SI controller 10, a deselective SI controller 20, an SI driver 30, and an SI selection identifier 40.

The program-interval voltage controller 5 divides a program interval into a plurality of time periods and controls the pass voltage level applied to the selective SI controller 10. A feature of controlling the pass voltage applied thereto during the program interval will be further detailed with reference to FIG. 9.

The selective SI controller 10 provides the SI driver 30 with one of the plurality of high voltages in response to an enabling signal transferred from the SI selection identifier 40. The selective SI controller 10 controls a high voltage, which is applied thereto from the high voltage generator 55 during the programming operation, in response to a control by the program-interval voltage controller 5. The structure of the selective SI controller 10 will be further detailed in FIG. 3 later.

The deselective SI controller 20 also provides the SI driver 30 with one of the plurality of high voltages in response to an enabling signal transferred from the SI selection identifier 40. The structure of the deselective SI controller 10 will be detailed in conjunction with FIG. 4 later.

The SI selection identifier 40 determines whether a current address corresponds to a selected or unselected area with reference to address and E-FUSE information. A selected area is assigned according to the higher M-numbered and lower N-numbered address bits of an input address. An unselected area is assigned to the rest of address bits of the input address. The E-FUSE information contains information about M and N. Further, the E-FUSE according to an example embodiment of the present invention can be replaced by a nonvolatile memory such a flash memory.

The SI driver 30 provides the word line driver 60 with one of outputs from the selective or deselective SI controller 10 or 20 in accordance with a result of the determination by the SI selection identifier 40. The structure of the SI driver 30 will be further detailed in FIG. 5 later.

Figure 3:
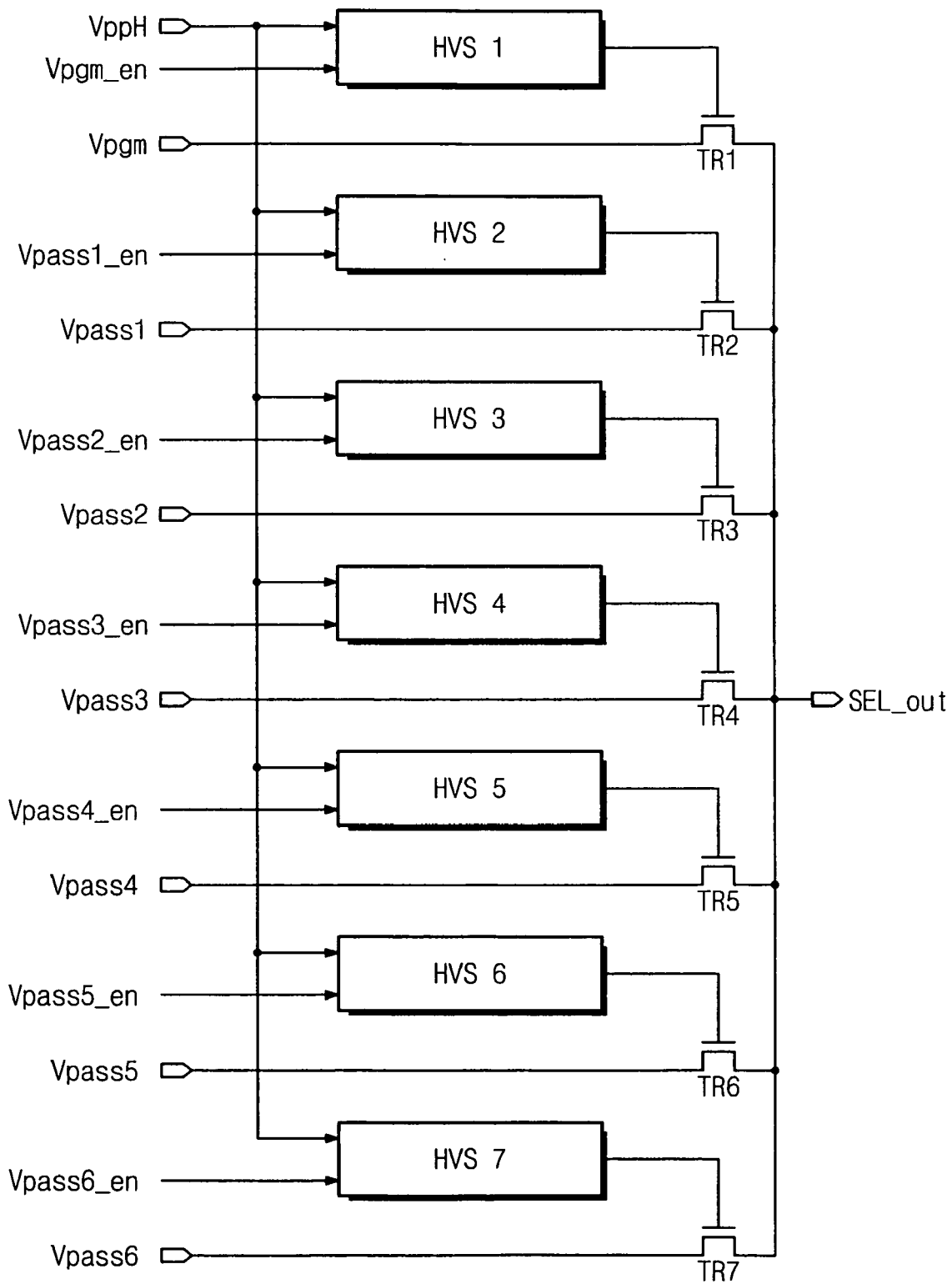
FIG. 3 is a circuit diagram illustrating the selective SI controller shown in FIG. 2.

FIG. 3 is a circuit diagram illustrating the selective SI controller 10 shown in FIG. 2.

Referring to FIG. 3, this example embodiment will be described by assuming that the total number of address bits for the word lines is 32. However, an example embodiment of the present invention may have more or less than 32 address bits for the word lines. While FIG. 3 just shows a single selective SI controller 10, the word line driver 60 may have a plurality of the selective SI controllers 10. For example, the word line driver 60 may have 32 selective SI controllers 10 in order to correspondingly supply the 32-bit address.

The selective SI controller 10 according to an example embodiment of the present invention includes first through seventh high-voltage switches HVS1~HVS7 and first through seventh NMOS transistors TR1~TR7. Drain nodes of the first through seventh NMOS transistors TR1~TR7 are commonly connected to an output terminal of the selective SI controller 10 from which a selection signal SEL_out is output.

The first high-voltage switch HVS1 receives a high voltage VppH and a program-voltage enabling signal Vpgm_en, with an output of the first high-voltage switch HVS1 being connected to a gate node of the first NMOS transistor TR1. The first NMOS transistor TR1 is connected between the program voltage Vpgm and the output terminal of the selective SI controller 10, with the first NMOS transistor TR1 being controlled by the first high-voltage switch HVS1.

The second high-voltage switch HVS2 receives the high voltage VppH and a first pass-voltage enabling signal Vpass1_en, with an output of the second high-voltage switch HVS2 being connected to a gate node of the second NMOS transistor TR2. The second NMOS transistor TR2 is connected between a first pass voltage Vpass1 and the output terminal of the selective SI controller 10, with the second NMOS transistor TR2 being controlled by the second high-voltage switch HVS2.

The third high-voltage switch HVS3 receives the high voltage VppH and a second pass-voltage enabling signal Vpass2_en, with an output of the third high-voltage switch HVS3 being connected to a gate node of the third NMOS transistor TR3. The third NMOS transistor TR3 is connected between a second pass voltage Vpass2 and the output terminal of the selective SI controller 10, with the third NMOS transistor TR3 being controlled by the third high-voltage switch HVS3.

The fourth high-voltage switch HVS4 receives the high voltage VppH and a third pass-voltage enabling signal Vpass3_en, with an output of the fourth high-voltage switch HVS4 being connected to a gate node of the fourth NMOS transistor TR4. The fourth NMOS transistor TR4 is connected between a third pass voltage Vpass3 and the output terminal of the selective SI controller 10, with the fourth NMOS transistor TR4 being controlled by the fourth high-voltage switch HVS4.

The fifth high-voltage switch HVS5 receives the high voltage VppH and a fourth pass-voltage enabling signal Vpass4_en, with an output of the fifth high-voltage switch HVS5 being connected to a gate node of the fifth NMOS transistor TR5. The fifth NMOS transistor TR5 is connected between the fourth pass voltage Vpass4 and the output terminal of the selective SI controller 10, with the fifth NMOS transistor TR5 being controlled by the fifth high-voltage switch HVS5.

The sixth high-voltage switch HVS6 receives the high voltage VppH and a fifth pass-voltage enabling signal Vpass5_en, with an output of the sixth high-voltage switch HVS6 being connected to a gate node of the sixth NMOS transistor TR6. The sixth NMOS transistor TR6 is connected between the fifth pass-voltage Vpass5 and the output terminal of the selective SI controller 10, with the sixth NMOS transistor TR6 being controlled by the sixth high-voltage switch HVS6.

The seventh high-voltage switch HVS7 receives the high voltage VppH and a sixth pass-voltage enabling signal Vpass6_en, with an output of the seventh high-voltage switch HVS7 being connected to a gate node of the seventh NMOS transistor TR7. The seventh NMOS transistor TR7 is connected between the sixth pass-voltage Vpass6 and the output terminal of the selective SI controller 10, with the seventh NMOS transistor TR7 being controlled by the seventh high-voltage switch HVS7.

The selective SI controller 10 according to an example embodiment of the present invention provides the SI driver 30 with one of the voltages program voltage Vpgm and the first through sixth pass voltages Vpass1~Vpass6 in response to a result of the determination by the SI selection identifier 40.

First through third local voltages Vlocal1~Vlocal3 according to an example embodiment of the present invention act as pass voltages that are applied to the programmed or non-programmed memory cells, in a selected area, on memory cells to be programmed (hereinafter referred to as 'program memory cells') in order to extend the pass voltage window.

Figure 4:
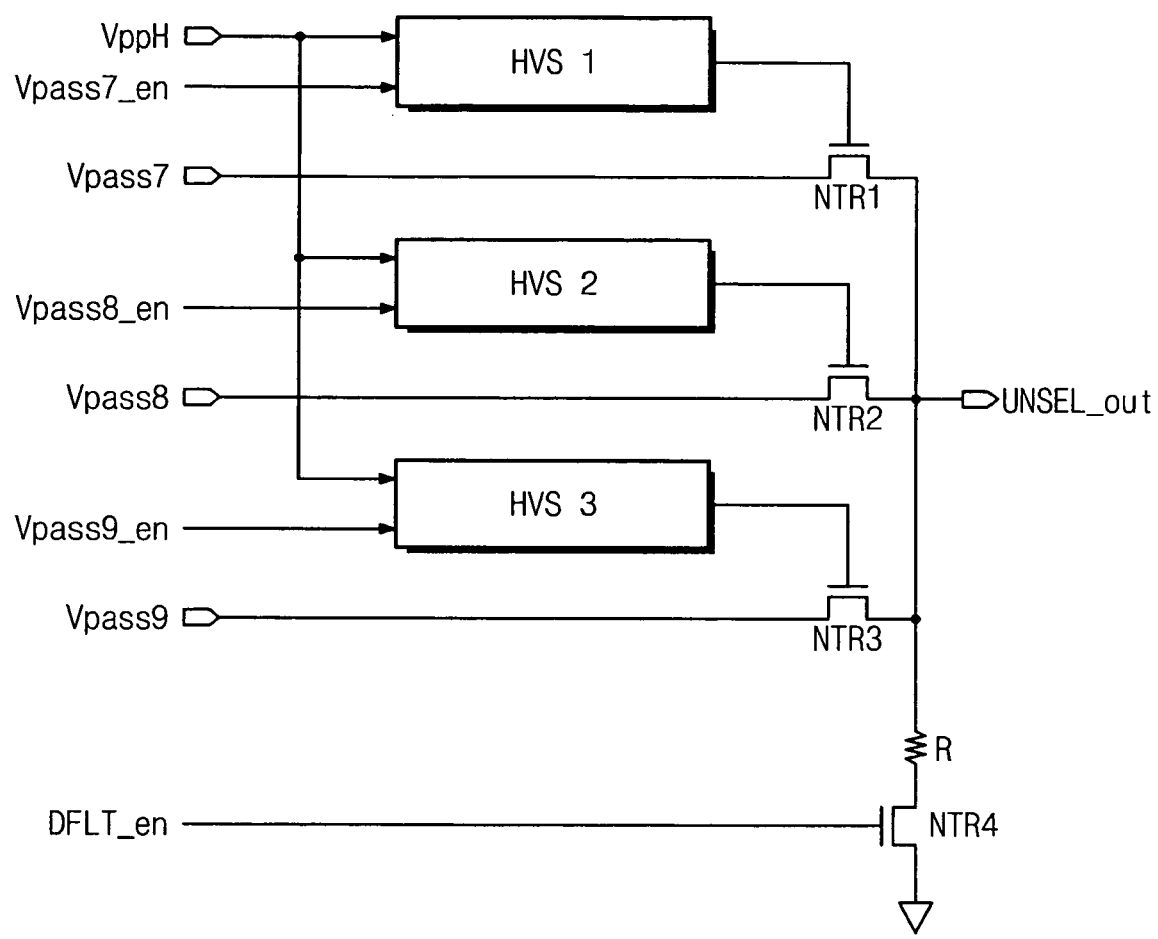
FIG. 4 is a circuit diagram illustrating the deselective SI controller shown in FIG. 2.

FIG. 4 is a circuit diagram illustrating the deselective SI controller 20 shown in FIG. 2.

Referring to FIG. 4, this example embodiment will be described by assuming that the total number of address bits for the word lines is 32. However, an example embodiment of the present invention may have more or less than 32 address bits for the word lines. While FIG. 4 just shows a single deselective SI controller 20, the word line driver 60 may have a plurality of the deselective SI controllers 20. For example, the word line driver 60 may have 32 deselective SI controllers 20 in order to correspondingly supply the 32-bit address.

The deselective SI controller 20 according to an example embodiment of the present invention includes first through third high-voltage switches HVS1~HVS3, first through fourth NMOS transistors NTR1~NTR4, and a resistor R. Drain nodes of the first through third NMOS transistors NR1~NR3 are commonly connected to an output terminal of the deselective SI controller 10 from which a deselection signal UNSEL_out is output.

The first high-voltage switch HVS1 receives the high voltage VppH and a seventh pass-voltage enabling signal Vpass7_en, with an output of the first high-voltage switch HVS1 being connected to a gate node of the first NMOS transistor NTR1. The first NMOS transistor NTR1 is connected between the seventh pass voltage Vpass7 and the output terminal of the deselective S1 controller 20, with the first NMOS transistor NTR1 being controlled by the first high-voltage switch HVS1.

The second high-voltage switch HVS2 receives the high voltage VppH and an eighth pass-voltage enabling signal Vpass8_en, with an output of the second high-voltage switch HVS2 being connected to a gate node of the second NMOS transistor NTR2. The second NMOS transistor NTR2 is connected between an eighth pass voltage Vpass8 and the output terminal of the deselective SI controller 20, with the second NMOS transistor NTR2 being controlled by the second high-voltage switch HVS2.

The third high-voltage switch HVS3 receives the high voltage VppH and a ninth pass-voltage enabling signal Vpass9_en, with an output of the third high-voltage switch HVS3 being connected to a gate node of the third NMOS transistor NTR3. The third NMOS transistor NTR3 is connected between a ninth pass voltage Vpass9 and the output terminal of the deselective SI controller 20, with the third NMOS transistor NTR3 being controlled by the third high-voltage switch HVS3.

The resistor R is connected between the output terminal of the deselective SI controller 20 and a source node of the fourth NMOS transistor NTR4. The fourth NMOS transistor NTR4 is connected between the resistor R and the ground voltage VSS, with the fourth NMOS transistor NTR4 being controlled by a default enabling signal DFLT_en.

The deselective SI controller 20 according to an example embodiment of the present invention provides the SI driver 30 with one of the seventh through ninth pass voltages Vpass7~Vpass9 in response to a result of the determination by the SI selection identifier 40.

Figure 5:
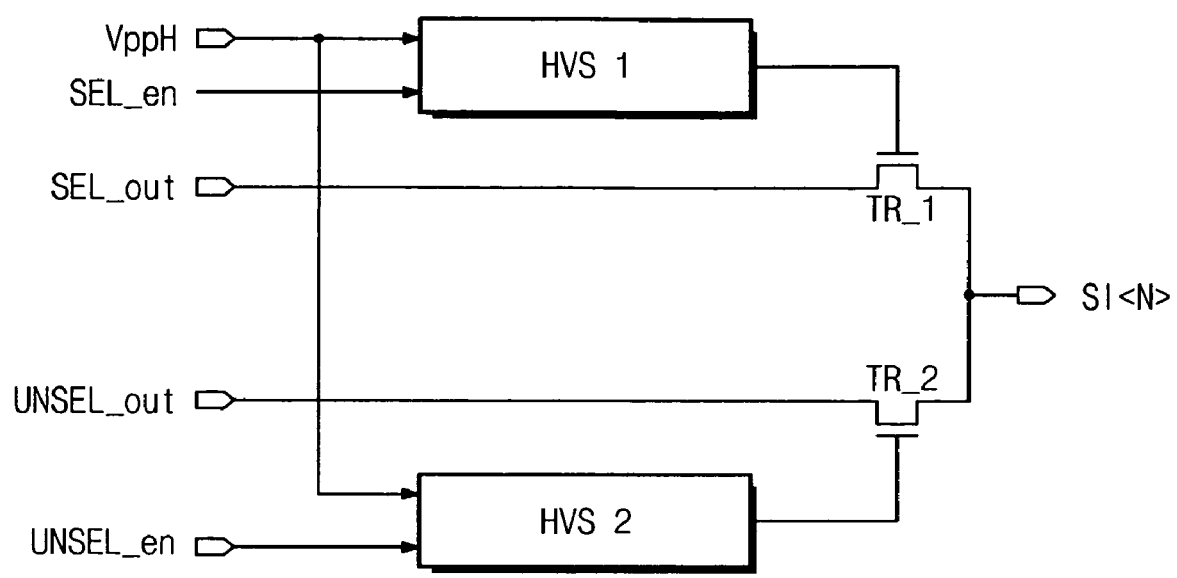
FIG. 5 is a circuit diagram illustrating the SI driver shown in FIG. 2.

FIG. 5 is a circuit diagram illustrating the SI driver 30 shown in FIG. 2.

Referring to FIG. 5, this example embodiment will be described by assuming that the total number of address bits for the word lines is 32. However, an example embodiment of the present invention may have more or less than 32 address bits for the word lines. While FIG. 5 just shows a single one of the SI driver 30, the word line driver 60 may have a plurality of the SI drivers 30. For example, the word line driver 60 may have 32 SI drivers 30 in order to correspondingly supply the 32-bit address.

The SI driver 30 according to an example embodiment of the present invention includes first and second high-voltage switches HVS1 and HVS2, and first and second NMOS transistors TRI_1~TR_2. Drain nodes of the first and second NMOS transistors TR_1 and TR_2 are commonly connected to an output terminal of the SI driver 30 from which a drive signal SI<N> is output.

The first high-voltage switch HVS1 receives the high voltage VppH and a selection enabling signal SEL_en transferred from the SI selection identifier 40, with an output of the first high-voltage switch HVS1 being connected to a gate node of the first NMOS transistor TR_1. The first NMOS transistor TR_1 is connected between the output SEL_out of the selective SI controller 10 and an output terminal of the SI driver 30, with the first NMOS transistor TR_1 being controlled by the first high-voltage switch HVS1.

The second high-voltage switch HVS2 receives the high voltage VppH and a deselection enabling signal UNSEL_en transferred from the SI selection identifier 40, with an output of the second high-voltage switch HVS2 being connected to a gate node of the second NMOS transistor TR_2. The second NMOS transistor TR_2 is connected between the output UNSEL_out of the deselective SI controller 20 and an output terminal of the SI driver 30, with the second NMOS transistor TR_2 being controlled by the second high-voltage switch HVS1.

Figure 6:
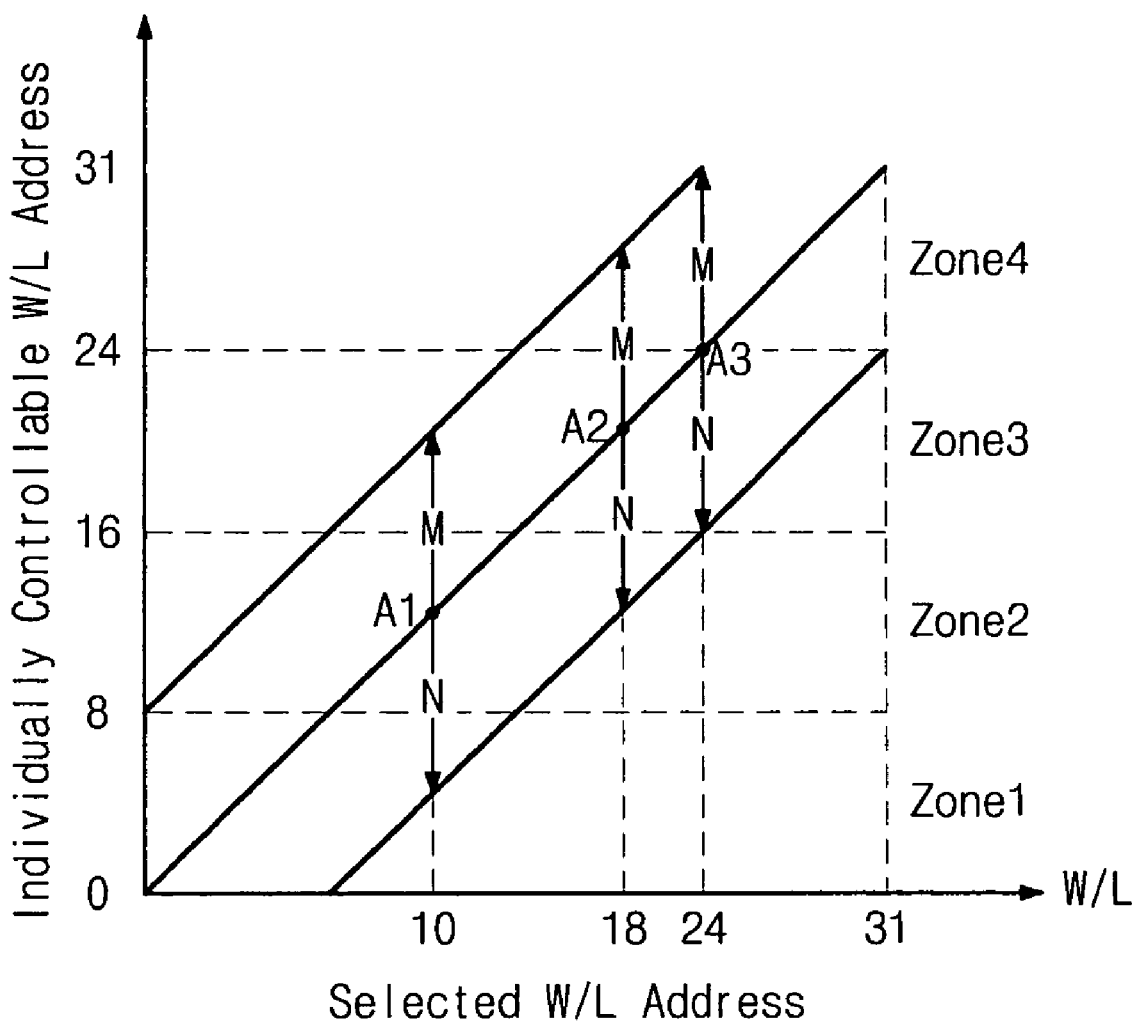
FIG. 6 is a graphic diagram showing zones of a word line address according to an example embodiment of the present invention.

FIG. 6 is a graphic diagram showing zones of a word line address according to an example embodiment of the present invention. In FIG. 6, it is also assumed an address for the word lines is formed of 32 bits from 0 (i.e., the first bit) to 31 (i.e., the 32nd bit). On the graph shown in FIG. 6, the X axis denotes the selected word-line address and the Y axis denotes the individually controllable word-line address. Equation 1 below illustrates a possible address range S that may be selected.

$$A-N<S<A+M\ (M, N:\text{constant}, S\geq 0) \quad \text{(Equation 1)}$$

Referring to Equation 1, a selected area S ranges from a difference between an address A and a constant N, to a sum of the address A and a constant M.

The total word-line address TA according to an example embodiment of the present invention is divided into four zones Zone1~Zone4. For example, as summarized by Equation 2 below, the total word-line address TA is quadrisected to be composed of the four zones.

$$0 \leq Zone1 \leq TA/4$$

$$TA/4 < Zone2 \leq TA/2$$

$$TA/2 < Zone3 \leq 3TA/4$$

$$3TA/4 < Zone4 \leq TA \qquad \text{(Equation 2)}$$

The first zone Zone1 ranges from 0 to 7 (i.e., the 1st through 8th address bits) in the selected word-line address. The second zone Zone2 ranges from 8 to 15 (i.e., the 9th through 16th address bits) in the selected word-line address. The third zone Zone3 ranges from 16 to 23 (i.e., the 17th through 24th address bits) in the selected word-line address. The fourth zone Zone4 ranges from 24 to 31 (i.e., the 25th through 32nd address bits) in the selected word-line address.

Figure 7:
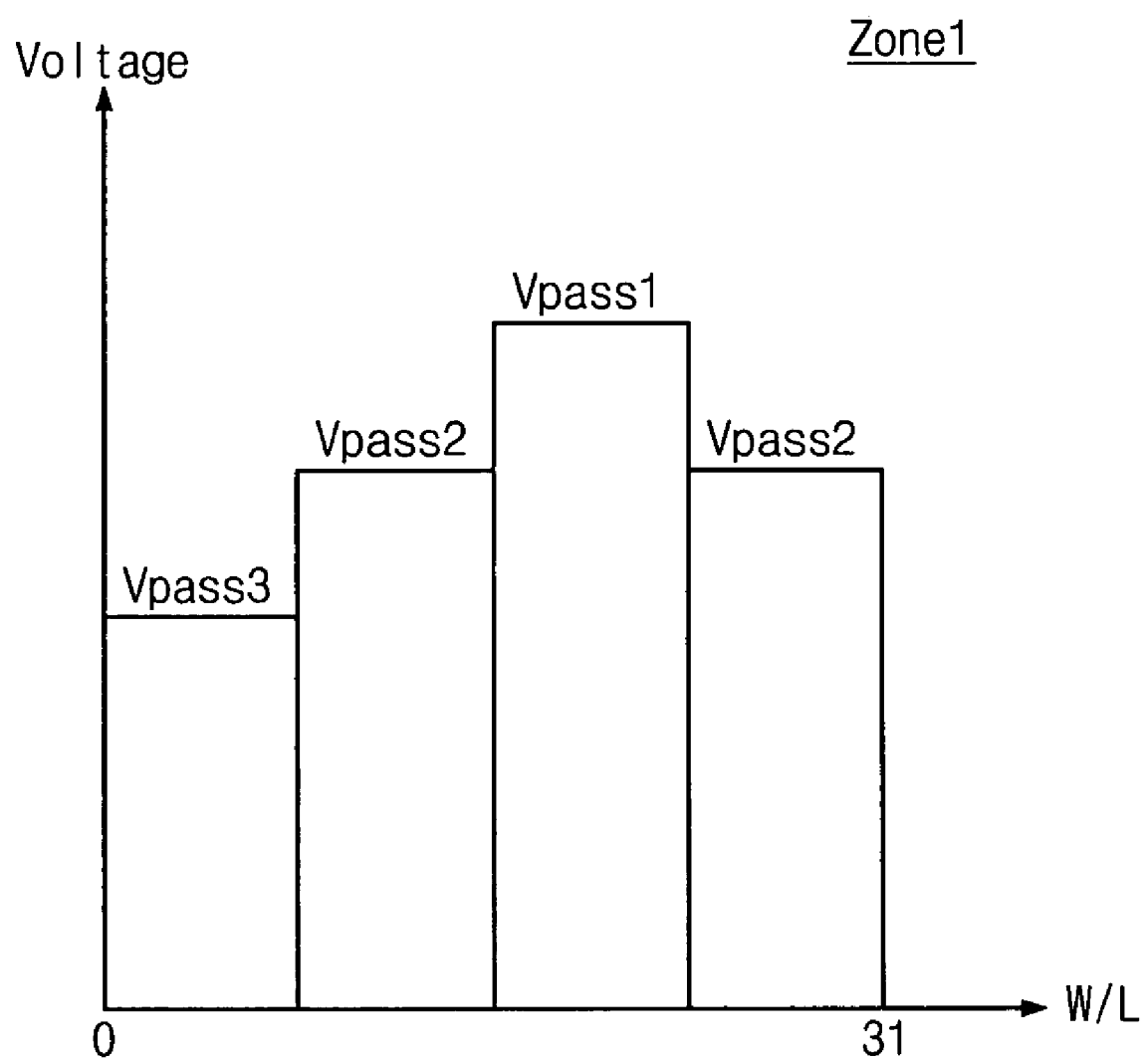
FIG. 7 is a graphic diagram depicting pass voltages according to the first zone shown in FIG. 6.
Figure 8:
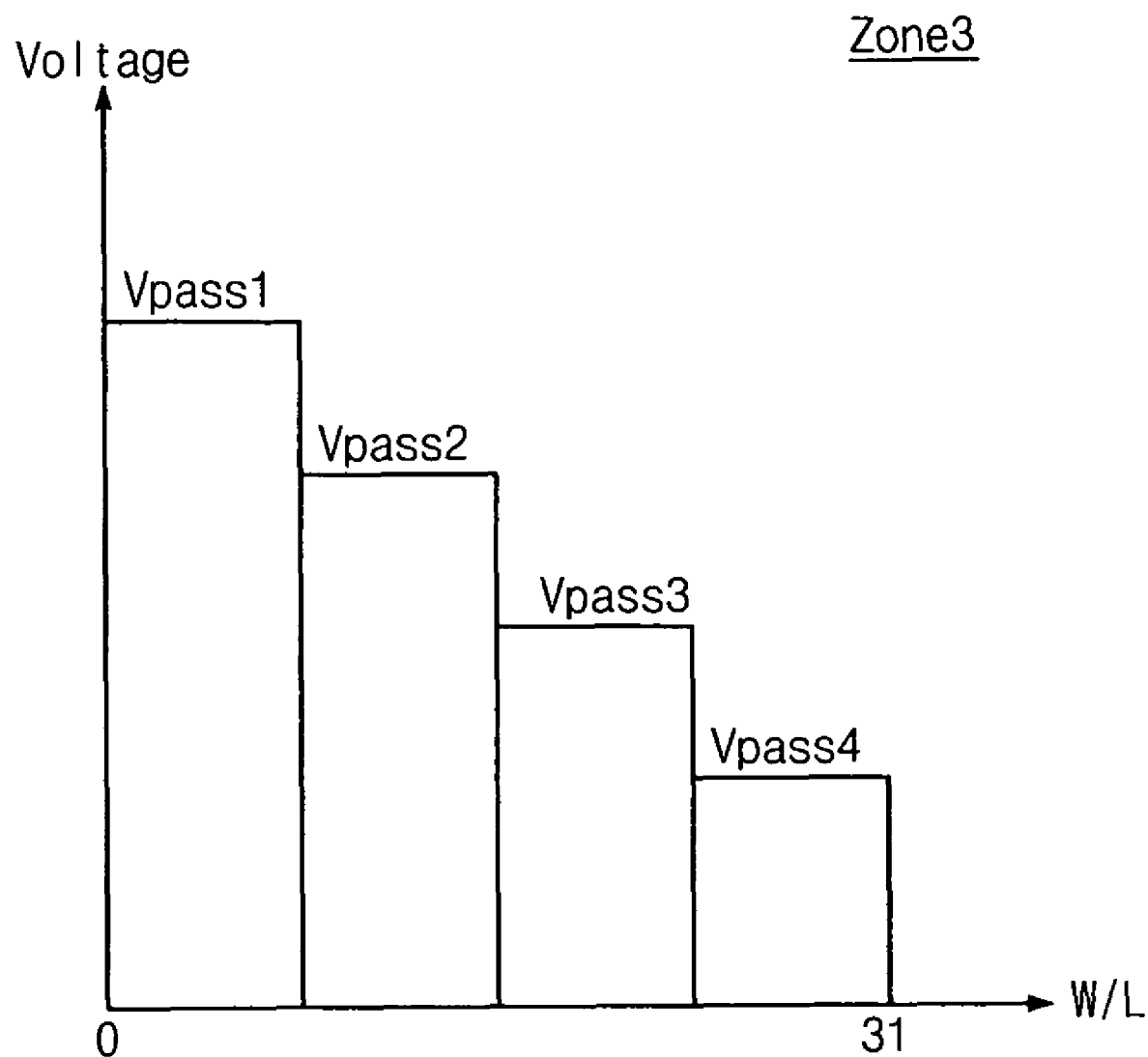
FIG. 8 is a graphic diagram depicting pass voltages according to the third zone shown in FIG. 6.

Thus, according to an example embodiment of the present invention, the total word-line address is segmented into the four zones and the pass voltages applied to the four zones are set differently or individually. For instance, the first and third zones Zone1 and Zone3 are configured as shown in FIGS. 7 and 8 respectively. In detail, levels of the plurality of pass voltages are allocated to the first and third zones Zone1 and Zone3 as depicted in FIGS. 7 and 8 respectively.

For example, if the total word-line address is formed of 32 bits and a selected word-line address is 15 (i.e., the 16th address bit), the selected word-line address 15 by Equations 1 and 2 is included in the second zone Zone2. Assuming that the constants M and N are all 5, the selected area S matches the word line addresses from 10 to 20.

FIG. 7 is a graphic diagram depicting the pass voltages according to the first zone Zone1 shown in FIG. 6, and FIG. 8 is a graphic diagram depicting the pass voltages according to the third zone Zone3 shown in FIG. 6.

In the graphs of FIGS. 7 and 8, the X axis denotes the word line address and the Y axis denotes the pass voltage level.

If a selected word-line address is included in the first zone Zone1, the pass voltages are applied to unselected word lines as shown in FIG. 7. If a selected word-line address is included in the third zone Zone3, the pass voltages are applied to unselected word lines as shown in FIG. 8.

The selected area S according to an embodiment of the present invention corresponds to a plurality of the zones in accordance with the highest address A+M and the lowest address A−N. Thus, the selected area S is supplied with the pass voltages differently according to the corresponding zone.

For example, Referring to FIGS. 6 through 8, if the lowest address A-N of the selected area S is in the first zone Zone1 (i.e., $0 \leq A-N \leq TA/4$): the pass voltages as shown in FIG. 7 are applied to the address included in the first zone Zone1; the pass voltages of another pattern (not shown) are correspondingly applied to the address included in the second zone Zone2; and the pass voltages as shown in FIG. 8 are applied to the address included in the third zone Zone3.

If the lowest address A-N of the selected area S is in the second zone Zone2 (i.e., $TA/4 \leq A-N \leq TA/2$): the pass voltages of another pattern (not shown) are correspondingly applied to the address included in the second zone Zone2; the pass voltages as shown in FIG. 8 are applied to the address included in the third zone Zone3; and the pass voltages of another pattern (not shown) are correspondingly applied to the address included in the fourth zone Zone4.

If the lowest address A−N of the selected area S is in the third zone Zone3 (i.e., $TA/2 \leq A-N \leq 3TA/4$): the pass voltages as shown in FIG. 8 are applied to the address included in the third zone Zone3; and the pass voltages of another pattern (not shown) are correspondingly applied to the address included in the fourth zone Zone4.

If the lowest address A−N of the selected area S is in the fourth zone Zone4 (i.e., $3TA/4 \leq A-N \leq TA$), the pass voltages of another pattern (not shown) are correspondingly applied to the address included in the fourth zone Zone4.

As an example, referring to FIG. 6, the first address bit A1 is now assumed as being 10 (i.e., the 11th address bit), which is included in the second zone Zone2. If the constants M and N are all 8, the selected area S corresponds to the range from 2 to 18.

In this case, the selected area corresponding to the first zone Zone1 from 2 to 7 is supplied with the pass voltages by the first zone Zone1 as shown in FIG. 7. The selected area corresponding to the second zone Zone2 from 8 to 15 is supplied with the pass voltages by the second zone Zone2. And, the selected area corresponding to the third zone Zone3 from 16 to 18 is supplied with the pass voltages by the third zone Zone3 as shown in FIG. 8.

The second address bit A2 is 18 (i.e., the 19th address bit), which is included in the third zone Zone3. If the constants M and N are all 8, the selected area S corresponds to the range from 10 to 26. In this case, the selected area corresponding to the second zone Zone2 from 10 to 15 is supplied with the pass voltages by the second zone Zone2. The selected area corresponding to the third zone Zone3 from 16 to 23 is supplied with the pass voltages by the second zone Zone3 as shown in FIG. 8. And, the selected area corresponding to the fourth zone Zone4 from 24 to 26 is supplied with the pass voltages by the fourth zone Zone4.

Next, the third address bit A3 is 24 (i.e., the 25th address bit), which is included in the third zone Zone3. If the constants M and N are all 8, the selected area S corresponds to the range from 16 to 31. In this case, the selected area corresponding to the third zone Zone3 from 16 to 23 is supplied with the pass voltages by the third zone Zone3 as shown in FIG. 8. The selected area corresponding to the fourth zone Zone4 from 24 to 31 is supplied with the pass voltages by the fourth zone Zone4.

Figure 9:
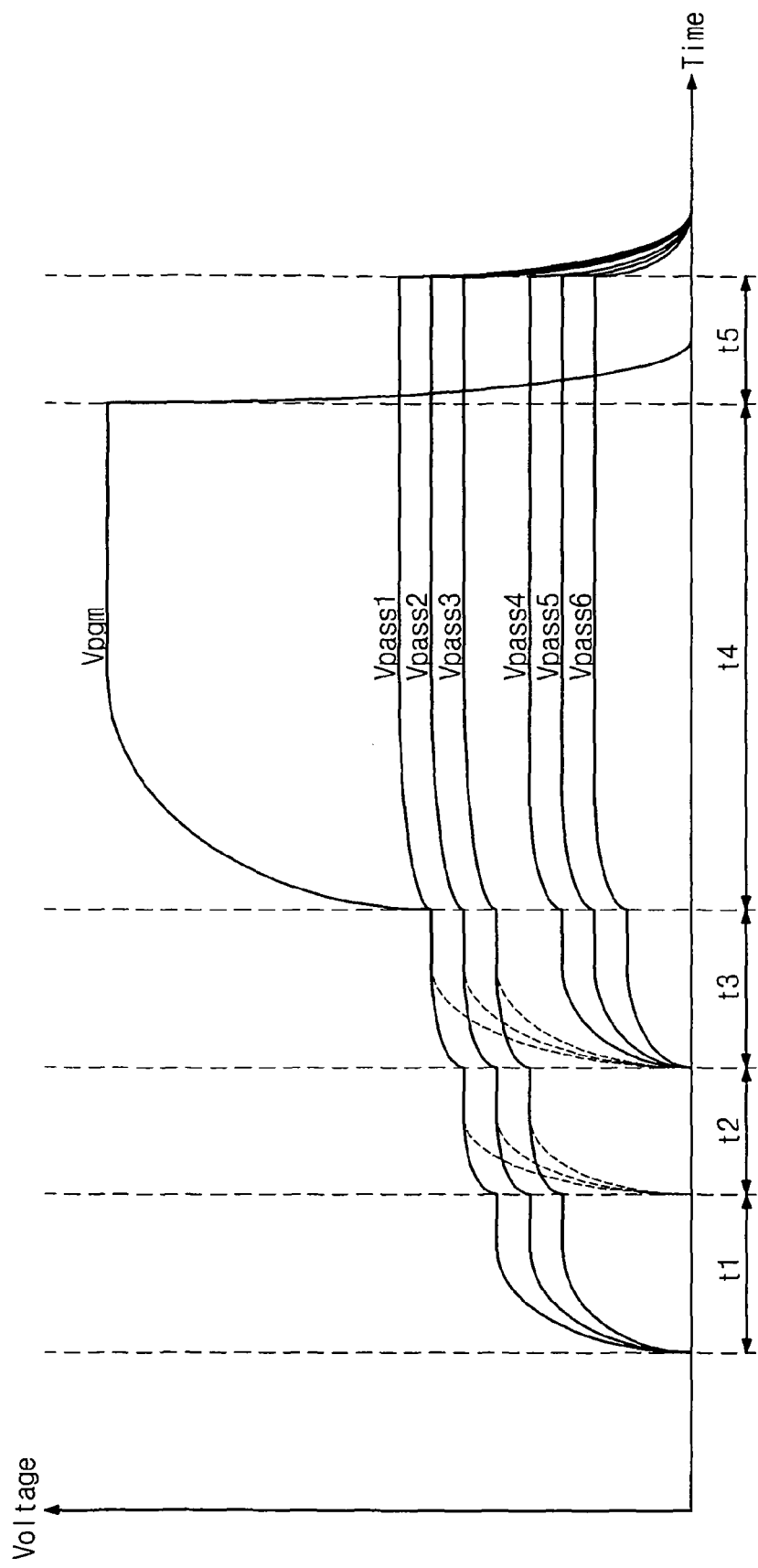
FIG. 9 is a timing diagram illustrating an operation of the program-interval voltage controller shown in FIG. 2.

FIG. 9 is a timing diagram illustrating an operation of the program-interval voltage controller 5 shown in FIG. 2.

In FIG. 9, the X axis denotes the time and the Y axis denotes the voltage level. The programming operation according to an example embodiment of the present invention is divided into periods t1~t5 along the X axis. For instance, the intervals t1~t3 form a first period for setting up the bit line and the interval t4 corresponds to a second period for applying the program voltage Vpgm.

During the first period (t1~t3) of the programming operation, the first through sixth pass voltages Vpass1~Vpass6 are stepped up to increase. During the second period (t4) of the programming operation, the first through sixth pass voltages Vpass1~Vpass6 are maintained on their constant levels. In the first period (t1~t3) of the programming operation, the first through sixth pass voltages Vpass1~Vpass6 are variable at increasing voltage levels.

The selective SI controller 10 receives the program voltage Vpgm and the first through sixth pass voltages Vpass1~Vpass6 from the HV Generator 55. The selective I controller 10 applies one of the program voltage Vpgm and the first through sixth pass voltages Vpass1~Vpass6 to the SI driver 30.

The program-interval voltage controller 5 according to an example embodiment of the present invention controls the first through third pass voltages Vpass1~Vpass3 to be applied to the selective SI controller 10 during the interval t1.

In the interval t2, the program-interval voltage controller 5 controls the first through third pass voltages Vpass1~Vpass3 to be higher than those levels of the interval t1. For example, the program-interval voltage controller 5 controls the first through third pass voltages Vpass1~Vpass3 to shift from the ground voltage level VSS toward levels higher than those of the interval t1.

In the interval t3, the program-interval voltage controller 5 controls the first through third pass voltages Vpass1~Vpass3 to be higher than those levels of the interval t2. For example, the program-interval voltage controller 5 controls the first through third pass voltages Vpass1~Vpass3 to shift from the ground voltage level VSS toward levels higher than those of the interval t2. The program-interval voltage controller 5 controls the fourth through sixth pass voltages Vpass4~Vpass6 to be applied to the selective SI controller 10 during the interval t3.

In the interval t4, the program-interval voltage controller 5 controls the first through sixth pass voltages Vpass1~Vpass6 to be higher than those levels of the interval t3.

The program-interval voltage controller 5 according to an example embodiment of the present invention controls the plurality of pass voltages, which are applied to the memory cells of the word line address, during the programming operation, which extends the pass voltage window.

Figure 10:
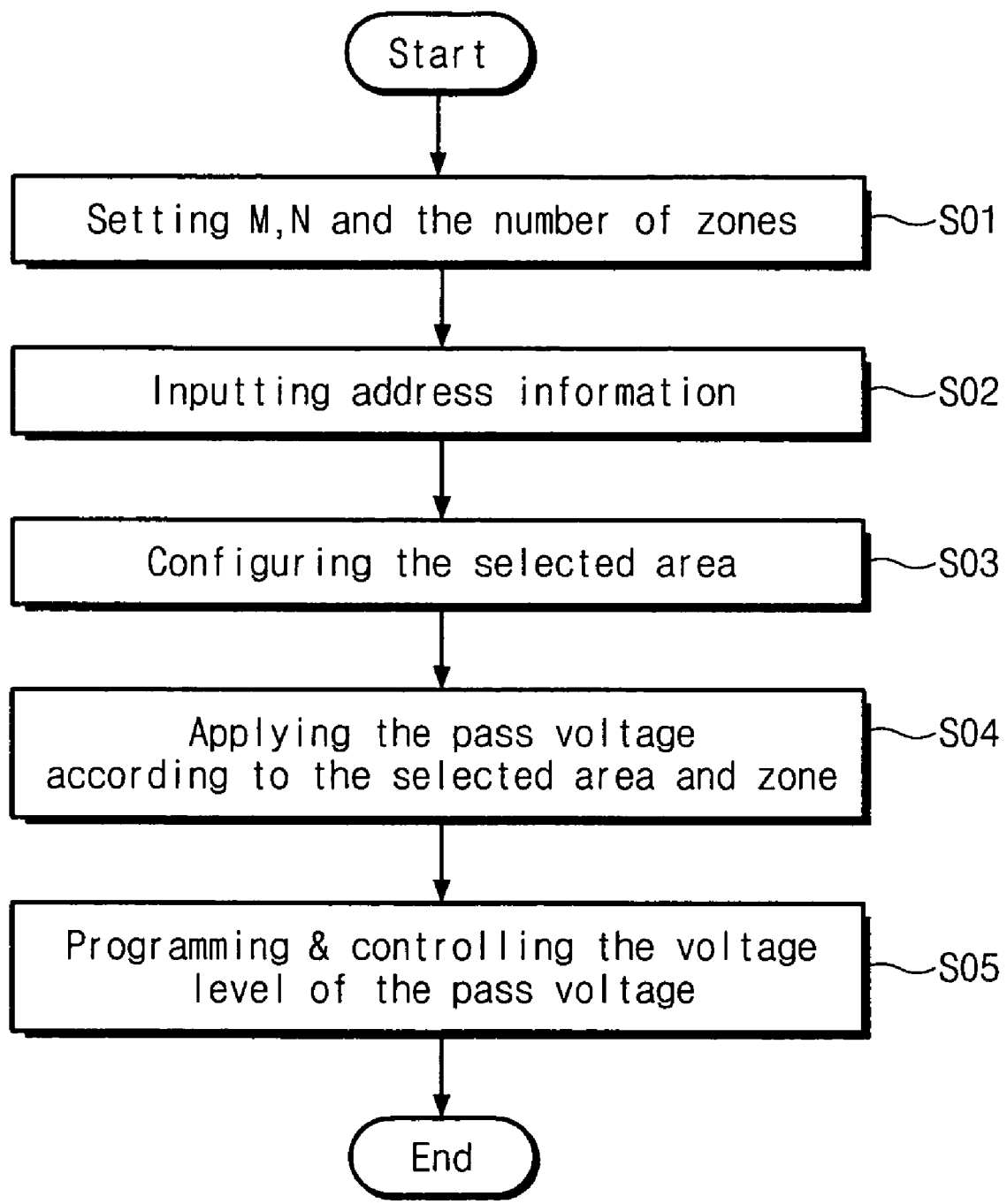
FIG. 10 is a flow chart showing a programming method for the flash memory device according to an example embodiment of the present invention.

FIG. 10 is a flow chart showing a programming method for the flash memory device according to an example embodiment of the present invention.

Referring to FIG. 10, the programming method for the nonvolatile memory device according to the present invention is carried out by the steps of setting the constants M and N, and the number of zones shown in FIGS. 6 through 8 (S01), inputting address information to be programmed (referred to as 'program address information') (S02), forming the selected area S shown in FIG. 6 with reference to the program address information (S03), applying the pass voltages to all addresses of the selected area according to the zones as shown in FIGS. 6-8 and applying predetermined or experimentally determined pass voltages to all addresses of the deselected area (S04), and controlling levels of the pass voltages applied to the selected area S during the programming operation (S05).

Consequently, according to an example embodiment of the present invention, the programming method for the flash memory is helpful to extending the pass voltage window by applying the pass voltages with various levels to the address of the selected area. And, the programming method for the flash memory according to an example embodiment of the present invention is able to control levels of the pass voltages applied during the programming intervals.

Flash memory devices are kinds of nonvolatile memories capable of keeping data stored therein even without a power supply. With a generally rapid increase in usage of mobile apparatuses such as cellular phones, personal digital assistants (PDA), digital cameras, portable gaming consoles, and MP3 players, flash memory devices are widely employed for code storage, as well as data storage. The flash memory devices may be also utilized in home applications such as high-definition televisions, digital versatile disks (DVDs), routers, and global positioning systems (GPSs).

Figure 11:
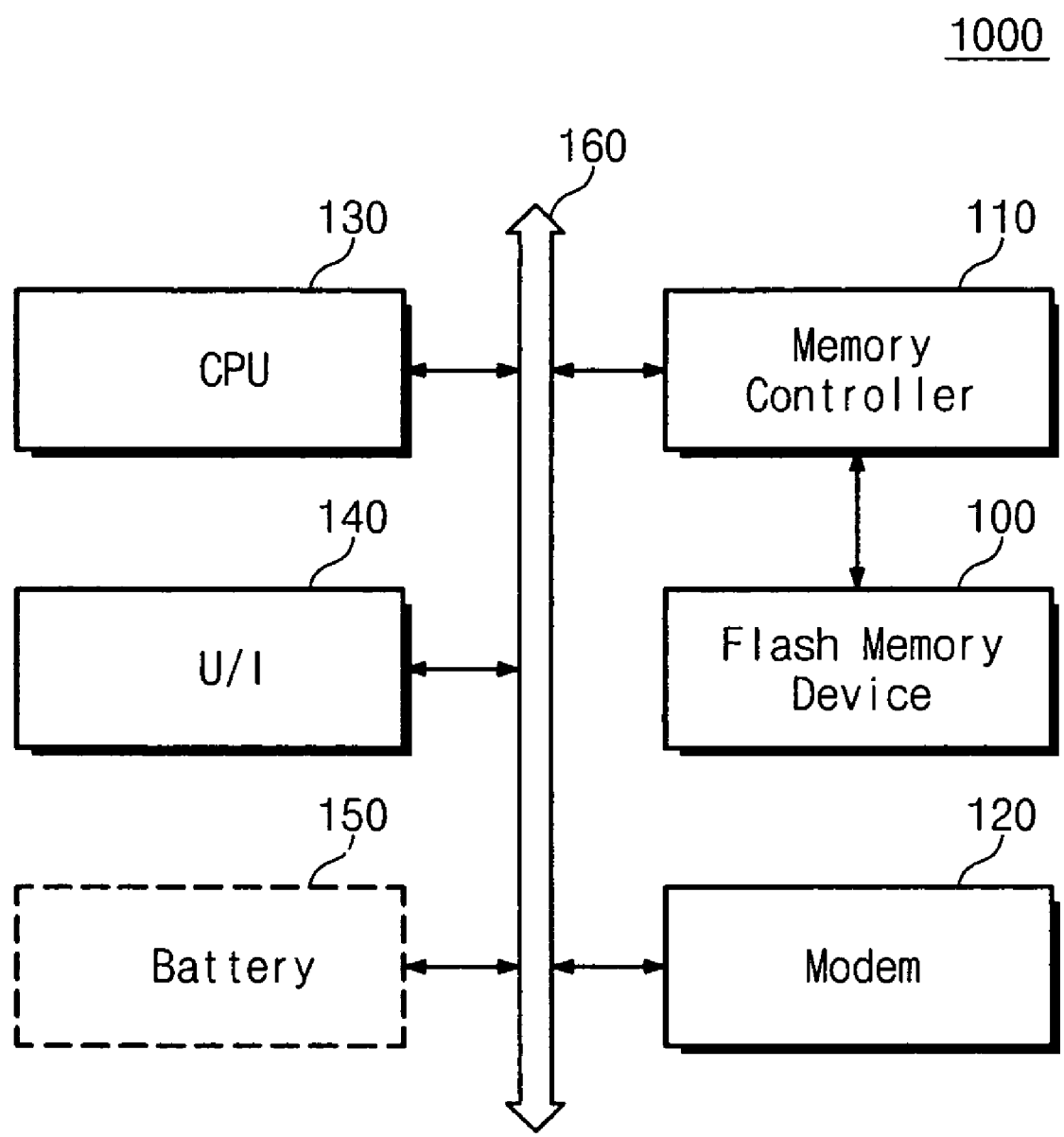
FIG. 11 is a block diagram of a computing system including a memory system according to an example embodiment of the present invention.

FIG. 11 is a block diagram of a computing system including a memory system according to an example embodiment of the present invention. A schematic structure of a computing system including the flash memory device of the present invention is illustrated in FIG. 11. The computing system 1000 according to an example embodiment of the present invention is organized by including a central processing unit (CPU) 130, a user interface 140, a modem 120 such as a baseband chipset, a memory controller 110, and the flash memory device 100, all of which are connected to each other by way of a bus 160. The memory controller 110 operates to control the flash memory device 100. The flash memory device 100 may be configured substantially as same as that shown in FIG. 1. In the flash memory device 100, N-bit data (where N is a positive integer) processed or to be processed by the CPU 130 may be stored through the memory controller 110. If the computing system 1000 shown in FIG. 11 is a kind of mobile apparatus, it may be further comprised of a battery 150 for supplying power thereto. Although not shown in FIG. 11, the computing system 1000 may be further equipped with an application chipset, a camera image processor (e.g., complementary metal-oxide-semiconductor (CMOS) image sensor; i.e., CIS), a mobile DRAM, etc. The memory controller 110 and the flash memory device 100, for example, are able to constitute a solid state drive/disk (SSD) using a nonvolatile memory for storing data. An example of an SSD is disclosed in U.S. Patent Publication No. 2006-0152981, which is incorporated herein by reference. The memory controller 110 and the flash memory device 100 are also able to form a memory card using a nonvolatile memory for storing data.

Figure 12:
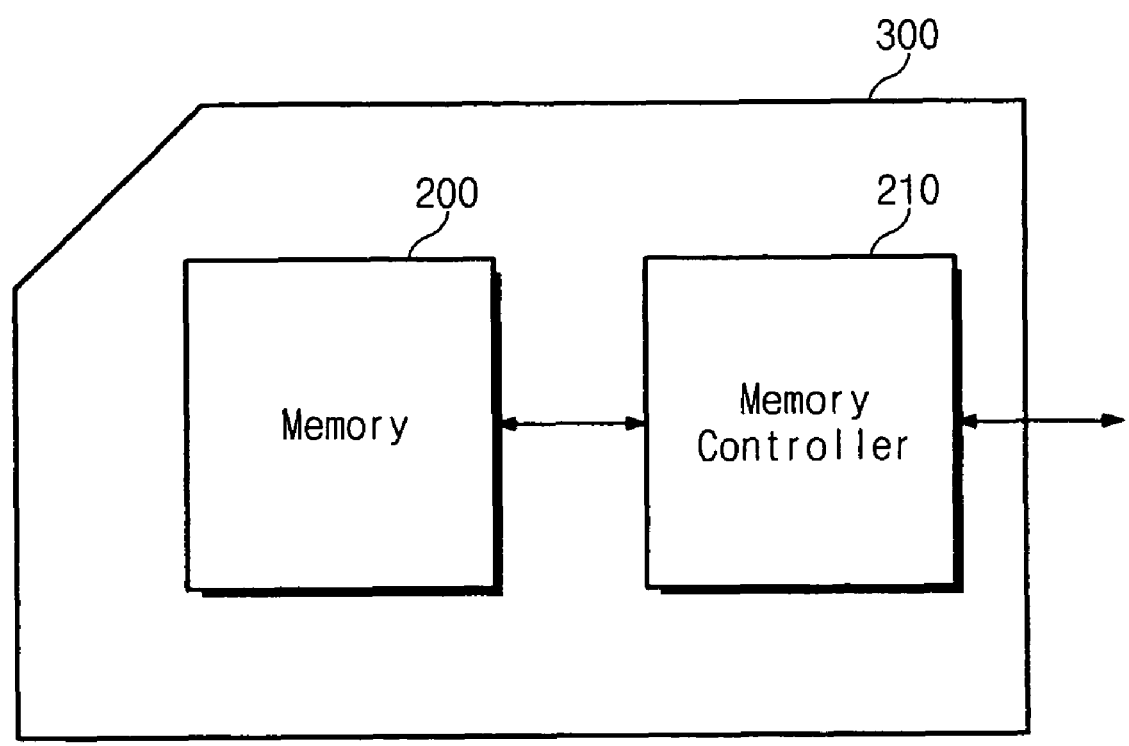
FIG. 12 is a block diagram of a memory-based storage unit according to an example embodiment of the present invention.

FIG. 12 is a block diagram of a memory-based storage unit according to an example embodiment of the present invention.

The memory-based storage unit 300 shown in FIG. 12 is implemented in a type of card by including a memory 200 and a memory controller 210. For instance, the card 300 may be a card adaptable to an industrial standard for using electronic apparatuses such as digital cameras, personal computers, and so on. Additionally, it can be seen that the memory controller 210 is able to control the memory 200 on basis to control signals received from a system (e.g., an external system) by the card 300.

The above-disclosed subject matter is to be considered illustrative, and not restrictive, and the appended claims are intended to cover all such modifications, enhancements, and other example embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
a memory cell array having a plurality of memory cells;
a high voltage generator configured to generate a plurality of pass voltages; and
a main controller including a selection identifier and a voltage controller, the selection identifier configured to determine a selected area and an unselected area of the memory cell array and to select a first pass voltage from the plurality of pass voltages to be applied to the selected area and a second pass voltage from the plurality of pass voltages to be applied to the unselected area, the voltage controller configured to shift the first pass voltage at a plurality of time intervals during a programming operation.

2. The flash memory device of claim 1, wherein the voltage controller is configured to incrementally shift a voltage level of at least the first pass voltage during a first period of the programming operation, where the first period includes at least one of the plurality of time intervals.

3. The flash memory device of claim 2, wherein the voltage controller is configured to maintain at least the first pass voltage at a constant voltage level during a second period of the programming operation, where the second period includes at least one of the plurality of time intervals.

4. The flash memory device of claim 1, wherein the voltage controller is configured to vary a voltage level of at least the first pass voltage during each of the time intervals of a first period of the programming operation, where the first period includes more than one of the plurality of time intervals.

5. The flash memory device of claim 1, wherein the selection identifier is configured to determine,
    higher and lower word-line address bits based on an input word-line address and constants M and N, where M and N are natural numbers,
    the selected area of the memory cell array based on the higher and lower word-line address bits, and
    the unselected area of the memory cell array based on the selected area, wherein
    the selection identifier is configured to select the first pass voltage to be applied to a word line of the selected area, and is configured to select the second pass voltage to be applied to a word line of the unselected area.

6. The flash memory device of claim 5, wherein word-line addresses of the memory array are divided into a first plurality of zones.

7. The flash memory device of claim 6, wherein the word-line addresses of the selected area are divided into a second plurality of zones.

8. The flash memory device of claim 5, wherein,
    the memory array is divided into a plurality of zones,
    a set of pass voltages from the plurality of pass voltages generated by the high voltage generator is associated with each zone of the plurality of zones, the set of pass voltages include at least one voltage and the set of pass voltages associated with each of the zones are different, and
    the selection identifier is configured to select the first pass voltage from the set of voltages associated with the zone corresponding to the selected area.

9. The flash memory device of claim 8, wherein the selection identifier is configured to select the first pass voltage based on the word-line address.

10. The flash memory device of claim 5, wherein information about the M and the N is stored in one of an electric fuse and a nonvolatile memory.

11. The flash memory device of claim 10, wherein the memory array is a nonvolatile memory and includes at least one of a NAND flash memory, a NOR flash memory, phase-change random access memory, and a magnetic random access memory.

12. The flash memory device of claim 5, wherein the M and the N are natural numbers and less than a total number of word lines in the memory array.

13. The flash memory device of claim 5, wherein the main controller further includes,
    a selective controller configured to select the first pass voltage from the plurality of pass voltages generated by the high voltage generator for the selected area in response to a set of enabling signals received from the selection identifier and configured to shift the first pass voltage according to a control signal received from the voltage controller, before the first pass voltage is supplied to the memory cell array.

14. The flash memory device of claim 13, wherein the main controller further includes,
    a deselective controller configured to select the second pass voltage from the plurality of pass voltages generated by the high voltage generator for the unselected area in response to the set of enabling signals, before the second pass voltage is supplied to the memory cell array.

15. A main controller, comprising:
    a selection identifier configured to determine,
        higher and lower word-line address bits based on an input word-line address and constants M and N, where the M and the N are natural numbers,
        a selected area of a memory array based on the higher and lower word-line address bits, and
        an unselected area of the memory array based on the selected area, where the selection identifier outputs a set of enabling signals based on the determined selected and unselected areas;
    a selective controller configured to receive a first plurality of pass voltages and selectively output one of the first plurality of pass voltages for the selected area in response to the set of enabling signals;
    a deselective controller configured to receive a second plurality of pass voltages and selectively output one of the second plurality of pass voltages for the unselected area in response to the set of enabling signals;
    a voltage controller configured to control the selective controller to shift at least one of the first plurality of pass voltages received by the selective controller during a plurality of time periods of a program interval; and
    a control driver configured to receive and selectively output one of the outputs of the selective and deselective controllers in response to the set of enabling signals.

16. A flash memory device, comprising:
    the main controller of claim 15;
    a memory array;
    a high voltage controller configured to generate the first and second plurality of pass voltages; and
    a word line driver configured to control word lines of the memory array based on the output of the control driver.

17. The flash memory device of claim 16, wherein,
    the memory array is divided into a plurality of zones, a set of pass voltages is associated with each zone of the plurality of zones, the set of pass voltages include at least one voltage and the set of pass voltages associated with each of the zones are different,
    the high voltage controller is configured to generate the set of pass voltages associated with each of the zones from at least the first plurality of pass voltages, and
    the selective controller is configured to select a first pass voltage from the set of voltages associated with the zone corresponding to the selected area based on the set of enabling signals.

18. A programming method of a flash memory, comprising:
    setting two constants M and N, where the M and the N are natural numbers;
    inputting word-line address information to be programmed;
    determining,
        the word-line address information to be programmed,
        higher and lower word-line address bits based on the word-line address information and the constants M and N, a selected area of the flash memory based on the higher and lower word-line addresses, and an unselected area of the flash memory based on the selected area;

applying a first pass voltage to an address of the selected area;

applying a second pass voltage to an address of the unselected area; and shifting the first pass voltage at a plurality of time intervals.

19. The method of claim 18, further comprising:

supplying a program voltage to the word-line address to be programmed.

20. The method of claim 18, further comprising:

dividing word-line addresses of the flash memory into a plurality of zones.

21. The method of claim 20, further comprising:

associating a set of pass voltages with each zone of the plurality of zones, the set of pass voltages include at least one voltage and the set of pass voltages associated with each of the zones are different, and selecting the first pass voltage from the set of voltages associated with the zone corresponding to the selected area.

22. The method of claim 20, further comprising:

selecting the first pass voltage based on the word-line address information.

23. The method of claim 18, wherein the constants M and N are less than a total number of word lines in the memory array.

* * * * *